US012624228B2

(12) United States Patent　　　(10) Patent No.:　US 12,624,228 B2
Paquet et al.　　　　　　　　　　　(45) Date of Patent:　　May 12, 2026

(54) PIEZOCERAMIC PASTES WITH HIGH CERAMIC CONTENT AND METHOD FOR PRINTING SAME

(71) Applicant: National Research Council of Canada, Ottawa (CA)

(72) Inventors: Chantal Paquet, Ottawa (CA); Silvio Elton Krüger, Brossard (CA); Thomas Lacelle, Ottawa (CA); Derek Aranguren Van Egmond, Ottawa (CA); Claudie Roy, Montreal (CA)

( * ) Notice: Subject to any disclaimer, the term of this patent is extended or adjusted under 35 U.S.C. 154(b) by 547 days.

(21) Appl. No.: 18/020,972

(22) PCT Filed: Aug. 24, 2021

(86) PCT No.: PCT/CA2021/051173
§ 371 (c)(1),
(2) Date: Feb. 13, 2023

(87) PCT Pub. No.: WO2022/040792
PCT Pub. Date: Mar. 3, 2022

(65) Prior Publication Data
US 2023/0295447 A1　　Sep. 21, 2023

Related U.S. Application Data

(60) Provisional application No. 63/069,253, filed on Aug. 24, 2020.

(51) Int. Cl.
*C09D 5/24*　　　(2006.01)
*B28B 1/00*　　　(2006.01)
(Continued)

(52) U.S. Cl.
CPC ................ *C09D 5/24* (2013.01); *B33Y 70/10* (2020.01); *C09D 5/02* (2013.01); *C09D 7/20* (2018.01);
(Continued)

(58) Field of Classification Search
CPC ... C09D 5/24; C09D 5/02; C09D 7/20; C09D 7/61; C09D 7/68; C09D 139/06;
(Continued)

(56) References Cited

U.S. PATENT DOCUMENTS 3,758,317 A　　9/1973　Moore, Jr.
5,250,476 A　　10/1993　Mogensen et al.
(Continued)

FOREIGN PATENT DOCUMENTS

CN　　109021267 A　　12/2018
CN　　110743384 A　　2/2020
(Continued)

OTHER PUBLICATIONS

International Search Report and Written Opinion dated Nov. 3, 2021 on PCT/CA2021/051173.
(Continued)

*Primary Examiner* — Matthew E. Hoban
*Assistant Examiner* — Lynne Edmondson
(74) *Attorney, Agent, or Firm* — Brunet & Co. Ltd.; Robert Brunet; Hans Koenig

(57) ABSTRACT
The present disclosure is directed towards a formulation for piezoelectric materials. The formulation may be printed including 2D or 3D printing. The formulation contains ceramic particles, a sol-gel, a high boiling point solvent and a binder.

19 Claims, 8 Drawing Sheets

(51) Int. Cl.

| | |
|---|---|
| *B29C 64/106* | (2017.01) |
| *B33Y 70/10* | (2020.01) |
| *C09D 5/02* | (2006.01) |
| *C09D 7/20* | (2018.01) |
| *C09D 7/40* | (2018.01) |
| *C09D 7/61* | (2018.01) |
| *C09D 139/06* | (2006.01) |
| *C09D 171/02* | (2006.01) |
| *H10N 30/853* | (2023.01) |
| *B33Y 10/00* | (2015.01) |
| *C08K 3/22* | (2006.01) |

(52) U.S. Cl.
CPC ................. *C09D 7/61* (2018.01); *C09D 7/68* (2018.01); *C09D 139/06* (2013.01); *C09D 171/02* (2013.01); *H10N 30/8536* (2023.02); *H10N 30/8542* (2023.02); *H10N 30/8554* (2023.02); *H10N 30/8561* (2023.02); *B28B 1/001* (2013.01); *B33Y 10/00* (2014.12); *C08K 2003/2237* (2013.01); *C08K 2003/2244* (2013.01); *C08K 2201/001* (2013.01)

(58) Field of Classification Search
CPC ............. C09D 171/02; H10N 30/8536; H10N 30/8542; H10N 30/8554; H10N 30/8561; B33Y 10/00; B33Y 80/00; B29C 64/106; B28B 1/001
See application file for complete search history.

(56) References Cited

U.S. PATENT DOCUMENTS

| | | | |
|---|---|---|---|
| 6,284,682 | B1 | 9/2001 | Troczynski et al. |
| 9,073,788 | B2 | 7/2015 | Lin et al. |
| 9,758,425 | B2 | 9/2017 | Bockmeyer et al. |
| 10,590,036 | B2 | 3/2020 | Bockmeyer et al. |
| 2001/0041216 | A1 | 11/2001 | Sakamaki et al. |
| 2006/0121258 | A1 | 6/2006 | Kim et al. |
| 2011/0296767 | A1 | 12/2011 | Lee et al. |
| 2013/0059148 | A1 | 3/2013 | Hwang et al. |
| 2015/0035209 | A1 | 2/2015 | Shah et al. |
| 2019/0054659 | A1 | 2/2019 | Tseng et al. |

FOREIGN PATENT DOCUMENTS

| | | | | |
|---|---|---|---|---|
| JP | 2000026163 | A | 1/2000 | |
| KR | 20150075800 | A | 7/2015 | |
| KR | 20160124725 | A | 10/2016 | |
| WO | WO-03099741 | A1 * | 12/2003 | .......... C04B 35/488 |
| WO | 2018/085936 | A1 | 5/2018 | |

OTHER PUBLICATIONS

Atkinson A, et al. Journal of Sol-Gel Science and Technology 8, 1093-1097 (1997).
Bandyopadhyay A, et al. J. Am. Ceram. Soc., 80 [6] 1366-72 (1997).
Bodkhe S, et al. ACS Appl. Mater. Interfaces 2017, 9, 20833-20842.
Bodkhe S, et al. ACS Appl. Energy Mater. 2018, 1, 2474-2482.
Chen W, et al. Ceramics International 45 (2019) 4880-4885.
Cheng J, et al. Sensors 2019, 19, 4078; doi: 10.3390/s19194078.
Cui H, et al. Nature Materials, Supplementary Information. https://doi.org/10.1038/s41563-018-0268-1.
Destino JF, et al. Adv. Mater. Technol. 2018, 3, 1700323.
Dufaud O, et al. Journal of the European Ceramic Society 22 (2002) 2081-2092.
Dufaud O, et al. Smart Sensors, Actuators, and MEMS, Jung-Chih Chiao, Vijay K. Varadan, Carles Cané, Editors, Proceedings of SPIE vol. 5116 (2003).
Duoss EB, et al. Adv. Mater. 2007, 19, 3485-3489.
Halloran JW. Annu. Rev. Mater. Res. 2016. 46:19-40.
Hensleigh R, et al. Nature Electronics | vol. 3 | 216 Apr. 2020 | 216-224.
Kobayashi M, et al. Smart Mater. Struct. 16 (2007) 317-322.
Lahtinen R, et al. Smart Mater. Struct. 16 (2007) 2571-2576.
Liu F, ete al. Rapid Prototyping Journal, 24/9 (2018) 1421-1427.
Morissette SL, et al. J. Am. Ceram. Soc., 84 [11] 2462-68 (2001).
Rosental T, e et al. Adv. Eng. Mater. 2019, 21, 1900604.
Wang W, et al. Journal of the European Ceramic Society 40 (2020) 682-688.
Yao D, et al. Adv. Funct. Mater. 2019, 1903866.
Zhang Y. Chapter 57, Piezoelectric Paint Sensors for Ultrasonics-based Damage Detection. Encyclopedia of Structural Health Monitoring. Edited by Christian Boller, Fu-Kuo Chang and Yozo Fujino (2009).
Zhou X, et al. Nano Energy 72 (2020) 104676.

* cited by examiner a) Direct Piezoelectric Effect:

b) Indirect Piezoelectric Effect:

1

PIEZOCERAMIC PASTES WITH HIGH CERAMIC CONTENT AND METHOD FOR PRINTING SAME

CROSS-REFERENCE TO RELATED APPLICATIONS

This application is a national entry of PCT/CA2021/051173 filed Aug. 24, 2021 and claims the benefit of U.S. Provisional Application 63/069,253 filed Aug. 24, 2020, the entire contents of both of which are herein incorporated by reference.

FIELD

This application relates to piezoceramic pastes. More particularly, the present application relates to piezoceramic pastes with high ceramic content and methods for printing same.

BACKGROUND

Piezoelectric materials are able to convert mechanical pressure into electric potential (e.g., pressure sensor) and by the inverse piezoelectric effect, electric potential to a mechanical distortion (FIG. 1). They are widely used as sensors, actuators and energy harvesters in sectors such as aerospace, mining, nuclear, oil and gas as well as biomedical applications.

Despite their commercial success, broader application of piezoelectric ceramics is limited by two disadvantages. First, ceramic piezoelectric materials tend to be brittle and fragile resulting in poor device reliability and limitations in processability. Second, ceramic devices use expensive or complex manufacturing processes, such as sputtering, that require highly controlled heating and sintering at high temperatures (>250° C.), along with energy intensive steps such as cutting, milling, or grinding, rendering them cost prohibitive or impractical for many applications. There are emerging needs to manufacture high volume of embedded sensors to obtain more accurate sensing data. The current production methodologies of piezoelectric ceramics (e.g., lead zirconate titanate (PZT)) often entail numerous steps to their preparation processing, and are labor and time intensive with low freedom to modify design parameters. Commercial products that provide the manufacturing solutions, such as those based on PVDF polymers, do not meet the performance requirements needed for most sensing applications.

Therefore, there is a need for material processing that is additive, allowing increased design freedom and ease of integration into parts.

SUMMARY

In an aspect of the present disclosure, there is provided a formulation comprising: a binder; ceramic particles and a sol-gel.

In another aspect, the above formulation comprises a polymer binder.

In another aspect, the binder is polyvinylpyrrolidone, polyacrylic acid, polyvinyl alcohol, polyethyleneglycol or any combination thereof.

In another aspect, the ceramic particles are selected from the group consisting of PZT particles or particles of materials having perovskite structures, or any combination thereof.

In another aspect, the ceramic particles are particles $BaTiO_3$, $KNbO_3$, ZnO, $BiFO_3$, $Bi_4Ti_3O_{12}$ or any combination thereof.

In another aspect, the ceramic particles are PZT particles.

In another aspect, the sol-gel comprises PZT, $BaTiO_3$, $KNbO_3$, ZnO, $BiFO_3$, $Bi_4Ti_3O_{12}$ or any combination thereof.

In another aspect, the above formulation comprises 40-80 wt. % of the ceramic particles based on the total weight of the formulation.

In another aspect, the above formulation comprises 0.05-5 wt. % of the binder based on the total weight of the formulation.

In another aspect, the above formulation comprises 10-20 wt. % of the sol-gel, based on the total weight of the formulation.

In another aspect, the above formulation is a printing paste

In an aspect of the present disclosure, there is provided a formulation comprising: a high boiling point solvent; ceramic particles and a sol-gel.

In another aspect, the above high boiling point solvent comprises 1-butanol, 2-methyl-2-propanol, 1-pentanol, 3-methyl-1-butanol, 2,2-dimethyl-1-propanol, cyclopentanol, 1-hexanol, cyclohexanol, 1-heptanol, 1-octanol, propylene carbonate, tetraglyme, 2-(2-methoxyethoxy)acetic acid or any combination thereof.

In another aspect, the above formulation further comprises a binder.

In another aspect, the above binder is a polymer binder.

In another aspect, the above binder comprises polyvinylpyrrolidone, polyacrylic acid, polyvinyl alcohol, polyethyleneglycol or any combination thereof.

In another aspect, the above formulation is a printing paste.

In another aspect of the present disclosure, there is provided a formulation comprising: ceramic particles; a sol-gel; a high boiling point solvent; and, a polymer binder.

In another aspect, there is provided a process for producing a piezoelectric material comprising providing the above formulation and depositing the above formulation onto a substrate.

In another aspect, the above depositing comprises printing.

In another aspect, the above printing comprises 2D printing, 3D printing or a combination thereof.

In another aspect, the above depositing comprises 3D-printing using extrusion, direct writing or stereolithography.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which.

DETAILED DESCRIPTION

Figure 1:
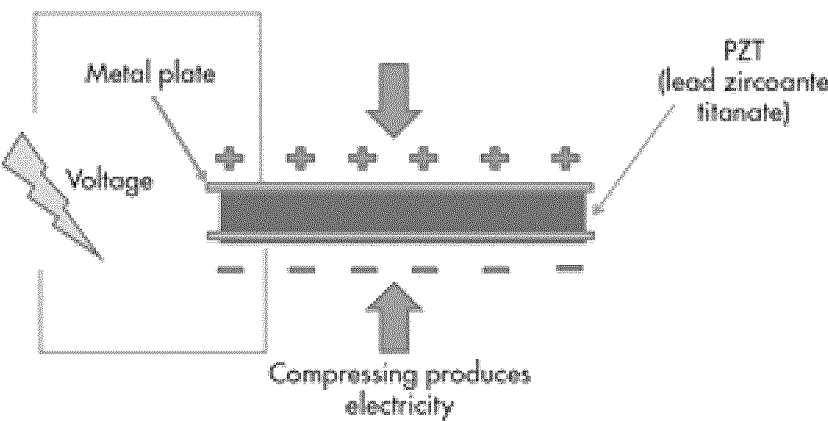
FIG. 1 depicts images that describe a) Direct and b) Indirect Piezoelectric Effects.
Figure 1:
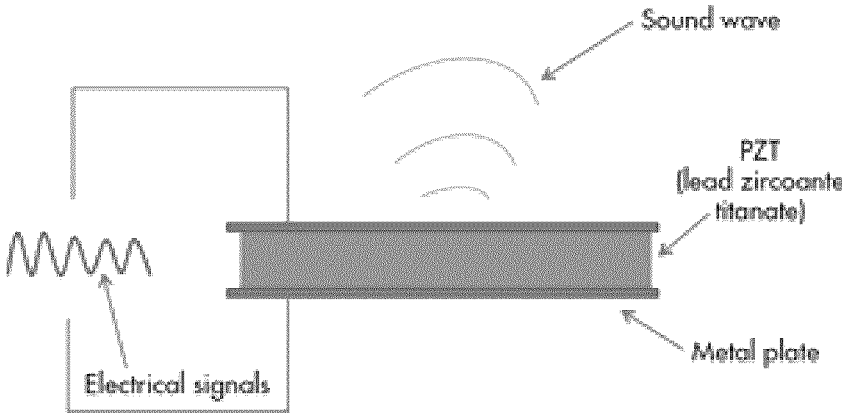

As used herein, the term PVDF refers to polyvinylidene fluoride.

As used herein PZT refers to lead zirconium titanate.

As used herein PVP refers to polyvinylpyrrolidone.

As used herein, BTO refers to BaTiO$_3$.

Common methods for 3D printing piezoelectrics and similar ceramic materials include: powder fusion, vat photopolymerization, binder bonding, and material extrusion. Powder fusion uses high-powered lasers to sinter or melt ceramic particles together (e.g., selective laser sintering, selective laser melting). Vat polymerization techniques involve material slurries comprising a photopolymerizable resin and a material filler. As the resin cures in the presence of light, the ceramic particles are incorporated into the polymer matrix and supported by the same (e.g., stereolithography, digital light processing, two-photon polymerization). Binder bonding is the deposition of a polymer binder in the presence of ceramic powder to promote adhesion between ceramic particles (e.g., inkjet printing, binder jet printing). Material extrusion uses a material paste that contains ceramic particles suspended in some sort of extrudable matrix such as solvents and/or polymer. The composite material is then extruded at either room temperature or at elevated temperatures depending on the matrix (e.g., direct ink writing, fused deposition modelling).

The material extrusion approach currently available in the art generally has two main limitations. First, as mentioned above, pastes used for material extrusion are generally made up of piezoelectric ceramic particles suspended in an extrudable matrix such as solvent or polymer. As the matrix material can make up a significant fraction of the matrix, it will have the effect of lowering the effect of the function material, in this case the piezoelectric response. Therefore, a desirable composition is one in which the matrix materials are precursors to ceramic particles and can be converted to functional piezoelectric material post-printing and sintering yielding a ceramic material with a high piezoelectric response. Second, pastes that are currently available in the art form cracks upon shrinkage on the count of evaporation of the carrier solvent in the matrix. These cracks that form within the printed object result in decreased piezoelectric performance by physically separating the piezoelectric particles. With stereolithography, while the photopolymer incorporated into the matrix can impart flexibility to the piezoelectric prints, it lowers the upper limit to the piezoelectric performance of the composite as the objects cannot be annealed to create larger piezoelectric domains due to the use of temperature sensitive polymer matrices.

The present invention advantageously provides piezoelectric components that have been 3D-printed and that are also capable of retaining their structure after being annealed.

The present invention provides a formulation that comprises ceramic particles suspended into a sol-gel/binder or polymer binder matrix. The formulation may be a printing paste.

The present invention preferably comprises a formulation comprising: ceramic particles; a sol-gel; a high boiling point solvent; and, a polymer binder.

The ceramic particles may be made of lead zirconium titanate (PZT) or other ceramic piezoelectric materials such as those with perovskite structures which include BaTiO$_3$, KNbO$_3$, ZnO, BiFO$_3$ and Bi$_4$Ti$_3$O$_{12}$. A combination of these may be used. The ceramic particles are preferably present in the formulation in an amount of 40-80 wt. % based on the total weight of the formulation. The ceramic particles preferably have an average particle diameter of 100 nm or greater, more preferably 500 nm or greater. The ceramic particles preferably have an average particle diameter of 40 μm or less, more preferably 10 μm or less. The ceramic particles are preferably crystalline. The ceramic particles possess piezoelectric properties.

The sol-gel may be initially prepared by using standard acid-catalyzed aqueous based sol-gel synthesis techniques. The sol-gel preferably comprises ceramic nanoparticles, especially PZT, BaTiO$_3$, KNbO$_3$, ZnO, BiFO$_3$, Bi$_4$Ti$_3$O$_{12}$ or any combination thereof, suspended in a gel. The ceramic particles are generally formed during the preparation of the sol-gel from ceramic precursors, for example by a reaction between a metal salt and a suitable oxide. For example, BaTiO$_3$ particles can be formed through the reaction of barium acetate and titanium (IV) isopropoxide during gelation of the sol-gel. The ceramic particles formed in this way are generally amorphous and have an average particle diameter of under 100 nm. The sol-gel is preferably present in the formulation in an amount of 10-20 wt. %, based on total weight of the formulation. The sol-gels are made from ceramic precursors, which provides a stiff material matrix helping to increase the piezoelectric response of the material. In addition, the sol-gels, upon sintering above their crystallization temperature, transform into piezoelectric materials further increasing the piezoelectric response of the material.

High boiling point solvents are liquids having a boiling point of at least 100° C. at a pressure of 760 mmHg.

Preferably, the boiling point is in a range of from 100° C. to 280° C. or from 100° C. to 250° C., more preferably 110° C. to 280° C. or 110° C. to 250° C. The high boiling point solvent preferably comprises an organic solvent or a mixture thereof. The high boiling point solvent preferably comprises an alcohol or mixtures of one or more alcohols with at least one other solvent. Some preferred solvents include 1-butanol, 2-methyl-2-propanol, 1-pentanol, 3-methyl-1-butanol, 2,2-dimethyl-1-propanol, cyclopentanol, 1-hexanol, cyclohexanol, 1-heptanol, 1-octanol, propylene carbonate, tetraglyme, 2-(2-methoxyethoxy)acetic acid or any mixture thereof. Where one of the solvents alone has a boiling point of less than 100° C., the presence of other solvents can raise the boiling temperature of the high boiling point solvent to 100° C. or higher. The high boiling point solvent is preferably present in the formulation in an amount of 3.5-35 wt. %, based on total weight of the formulation, preferably 5-35 wt. %. In some embodiments, the amount of high boiling solvent is preferably 3.5-12 wt. % or 3.5-7.5 wt. % or 3.5-5 wt. % or 3.7-4.5 wt. %. Especially when the high boiling point solvent has a boiling point over 100° C., the high boiling point solvent reduces clogging of a printing nozzle by the paste formulation ensuring more consistent printing and extending the shelf-life of the paste in comparison to lower boiling point solvents that tend to readily evaporate over time and during the printing step.

The binder is preferably a polymer binder. The polymer binder is preferably an organic polymer binder. The polymer binder is more preferably polyvinylpyrrolidone (PVP), polyacrylic acid (PAA), polyvinyl alcohol (PVA), polyethyleneglycol (PEG) or any combination thereof. The formulation preferably comprises 0.05-5 wt. %, more preferably 2-5 wt. %, of the binder based on the total weight of the formulation. In addition to being a binder, the polymer can act as a rheology modifier and/or a stabilizer. Further, the polymer can act to reduce cracking of the printed prints.

The formulation is preferably a paste, more preferably a printing paste. The formulation may be deposited on a substrate by any suitable method, for example 2-D printing (e.g., screen printing), 3-D printing (e.g., material extrusion or direct-ink-writing (DIW)), stereolithography, powder fusion, vat photopolymerization, binder bonding and the like. DIW is preferred. The formulation is advantageously extrudable, shear thinning or self-supporting or any combination thereof.

The formulation may be deposited on any suitable substrate, for example a ceramic, a glass, a metal and the like.

The formulation preferably has a viscosity of 15,000 cP to 200,000 cP as measured when printing shear rates are in a range of 5-10 s$^{-1}$. The viscosity was evaluated using a coaxial cylinder rheometer by measurements of torque at controlled shear rates to yield viscosity profiling, shear thinning response, and yield stress. The formulation preferably forms a self-supporting structure on printing, the self-supporting structure having a yield stress of 100 Pa or greater. Yield stress is estimated as the inflection point in the graph of shear stress vs. shear rate. Shear stress is calculated as the product of Viscosity×Shear Rate (Units: Pa·s×s$^{-1}$=Pa).

The sol-gel nanoparticles and the binder allow for the tuning of the rheological properties of the paste such that the paste forms a uniform suspension and is capable of being deposited while also being able to support itself during printing. The binder, especially when a polymer binder, also serves to minimize cracks, delamination between printed layers and allows a high loading of the functional particles in the paste. In addition, the matrix, made of a sol-gel of lead zirconium titanate (PZT) or other piezoelectric material, becomes piezoelectrically active once pyrolyzed and therefore imparts the printed part greater piezoelectric response.

The high piezoelectric particle loading of these formulations as well as the use of sol-gel (e.g., sol-gel of PZT) as a matrix allows for high piezoelectric response of the printed objects, especially after annealing. The loading of the PZT particles is higher than what has been reported elsewhere and will contribute to a high piezoelectric response. In addition, the high ceramic loading of these formulations accompanied by a polymer binder helps to minimize the effect of solvent evaporation on the shrinkage.

EXAMPLES

Methods and Materials:

Lead zirconium titanate (PZT) ceramic particles were purchased from APC International. Sol-gel precursors, solvents and polyvinylpyrrolidone (MW=1.3 MDa), PVP, were purchased from Sigma-Aldrich with the exception of barium titanate powder (<3 um, 99 wt. %) and barium acetate (ACS reagent, 99%) which were purchased from Acros.

Prior to using PZT particles, large clusters of particles were broken down into individual particles. 40 g PZT particles were suspended in 40 mL of ethanol in a beaker. The dispersion was magnetically stirred and cooled in an ice bath while using a probe sonicator with a microtip 6 mm in diameter. The suspension was ultrasonicated for 25 minutes at 25 W (amplitude 15). The suspension of PZT particles was filtered and dried.

Sol-Gel Synthesis:

Sol-gels were prepared by adapting standard acid-catalyzed aqueous based sol-gel synthesis techniques. Unless otherwise mentioned, the sol-gels were used in the formulations as-synthesized.

To obtain an aqueous BTO sol-gel, 4 g barium acetate was mixed with 11.6 g glacial acetic acid. The mixture was heated to 60° C. until the barium acetate was completely dissolved. In a separate container, 1 g of titanium (IV) isopropoxide was dissolved in 1 g of isopropanol at room temperature (RT). Once the barium acetate solution was cooled to room temperature, it was then poured into titanium (IV) isopropoxide solution. The combined solutions were left to stir for 1 hour and then placed in an ice bath. During vigorous magnetic stirring, 12.76 g of MilliQ water was then poured into the cooled solution, and the solution was left to stir for 1 hour to form the aqueous BTO sol-gel.

To obtain an aqueous sol-gel containing lead, a mixture of particular titanium and zirconium alkoxides (mole ratio of Zr:Ti=52:48) was prepared along with the addition of particular solvents at room temperature. After raising the temperature of the solution to 90° C., a slight stoichiometric excess of lead acetate trihydrate was added and the mixture was allowed to cool back down to room temperature. Once at room temperature, additional solvents including a high boiling point solvent and water were added. The mixture was then left to stir overnight to obtain the aqueous sol-gel containing lead.

To obtain a lead-free aqueous sol-gel (Pb-free aqueous sol-gel), a similar process for making the sol-gel containing lead was used, but without the addition of lead acetate. Prior to the addition of water, acetylacetone was also added at a concentration of 250 ppm (w/w) to improve the stability of the lead-free aqueous sol-gel.

Printing:

Direct-ink-writing (DIW) was performed with a Hyrel System 30M tool-changing 3D printer. Using a SDS-30 printhead, ceramic sol-gel inks were loaded into a 30 cc syringe that attached to the extruder. Material was then extruded through luer-lok syringe tips of varying diameter. After connecting a syringe, the printer's Z-axis was calibrated and the heated printing surface was installed. A conductive Al-sheet substrate was chosen for easy removal and subsequent use during corona poling of the printed material. Standard three-dimensional shapes (cones, cubes, etc.) were imported from CAD software into the printer's open-source Repetrel slicing software to yield printhead movement information as g-code. Rectangular prisms were printed with varying layer heights to test poling penetration depths, yielding samples having thicknesses of 1 layer, 2 layers and 5 layers in the Z-direction. X and Y dimensions were each 15 mm.

For printing barium titanate pastes comprising BTO sol-gel and PZT pastes comprising Pb-free sol-gel, a syringe equipped with a 14-gauge (1.6 mm) flat-end metallic needle was filled with the ink (paste). The prints were configured to have a print velocity of 5 mm/s and layer thickness of 300 μm. The print bed was set to a temperature of 50° C.

For printing PZT pastes comprising polymer binder without a high boiling point solvent, a syringe was fit with a 15-gauge (1.37 mm) conical plastic tip for improved particle flow. The print bed was left at ambient temperature to slow the evaporation of volatile solvents. The ink (paste) was again deposited at a printing velocity of 5 mm/s, with the first layer slowed to 2.5 mm/s. Layer thickness was set to 300 μm.

For printing PZT pastes comprising PZT sol-gel, high boiling point solvent and polymer binder, a syringe was fit with a conical plastic tip ranging from 14 gauge (1.83 mm diameter) to 20 gauge (0.91 mm diameter) for improved particle flow. The print bed was left at ambient temperature to slow the evaporation of volatile solvents. The ink was deposited at a printing velocity of 5 mm/s, with the first layer slowed to 2.5 mm/s. Layer thickness was set between 300 μm and 500 μm.

Figure 3:
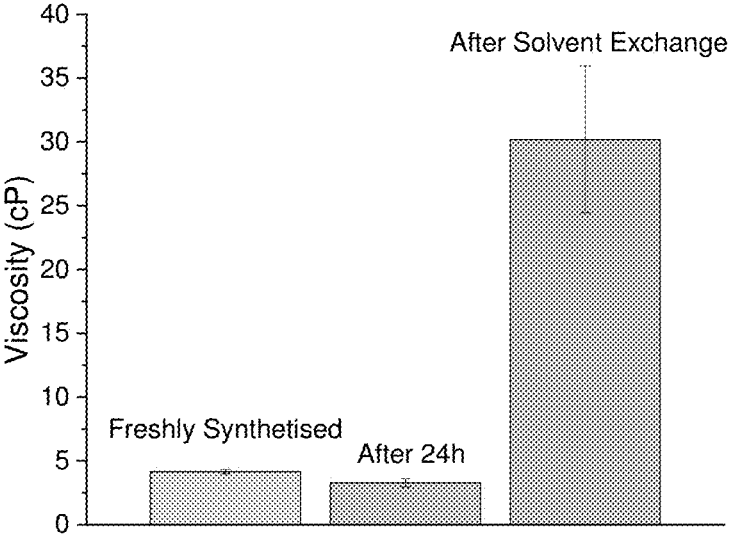
FIG. 3 depicts a comparison of the viscosity of the freshly synthesized sol-gel, sol-gel after 24 h synthesis and sol-gel after solvent exchange (purple). The error bars come from 2 different batches of sol-gel.

Rheology Design for DIW:

In order to hold the shape of a desired three-dimensional object, paste-like inks should extrude easily through the syringe nozzle and then rapidly regain self-supporting behaviour once deposited on the build surface. This describes a viscous fluid of shear-thinning character. Preliminary experiments confirmed all sol-gel inks tested exhibit a rapid decrease in viscosity with increasing shear rate (see FIG. 3.4). In order to determine the instantaneous viscosity of a material during printing, one must know the shear rate during extrusion through the nozzle. This is estimated by the relation:

$$\dot{\gamma}_{max} \approx \frac{4\dot{Q}}{\pi r^3}$$

where $\dot{\gamma}_{max}$ denotes the instantaneous shear rate induced at the nozzle walls, and $\dot{Q}$ is the volumetric flow rate through the nozzle, calculated by $\dot{Q}=Sr^2$ where S is the printing speed (velocity of the nozzle in mm/s) and r is the radius of the nozzle aperture. For a 14 G and 15 G nozzle, both travelling at 5 mm/s, the printing shear rate (PSR) thus becomes approx. 8.0 s$^{-1}$ and 9.3 s$^{-1}$, respectively. To measure the rheological properties of the paste-like inks, a Brookfield coaxial cylinder rheometer equipped with a model SC-14 spindle head was used. Samples were subjected to one measurement cycle ramping up to and down from a shear rate exceeding the calculated printing shear rate (see above).

Figure 2:
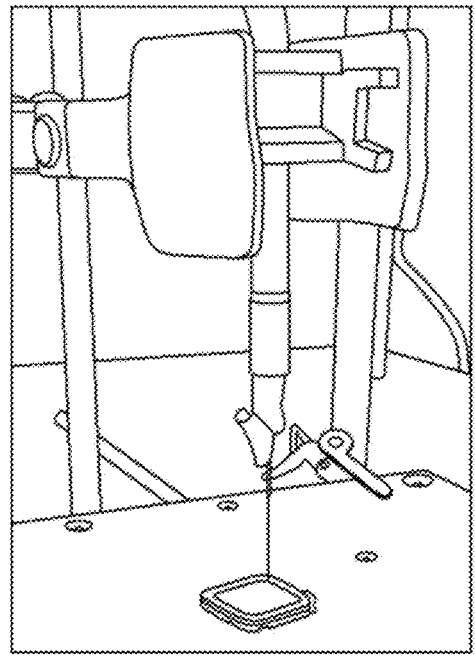
FIG. 2 depicts poling of a 3D printed PZT piezoceramic tile.

Ceramic piezoelectric materials need to be poled to present piezoelectric properties. Corona poling was used to pole the piezoceramic materials. In the poling process, a high electric field is applied across the ferroelectric film to align the dipoles. A low current of 25 kV DC source was used, with the needle acting as the positive electrode and the metal substrates to the piezoceramic film as the negative electrode. All samples were poled at room temperature. The poling process is represented on FIG. 2.

Sols were characterized using dynamic light scattering on a Malvern Zetasizer 3000HS. The viscosity and shear thinning of paste were characterized on a Brookfield RV-DV-III Ultra Rheometer and a DHR-2 from TA instrument. Electron microscope images were acquired on a Hitachi SU3500 or a Hitachi S-4700 SEM. The characterization of functionalized particles was done using a Fourier-transform infrared spectroscopy attenuated total reflectance (ATR-FITR). The $d_{33}$ constant of the printed piezo materials were measure using a $d_{33}$ tester meter from American Piezo.

Ink Formulations:

The viscosity of the sol-gel has a strong influence on the viscosity of the paste and as a result plays a key role in the printability of the paste. A sol-gel that is not viscous enough will not be usable for 3D printing as it will not have sufficient viscosity to self-support a printed structure and will not extrude controllably while printing. The paste formulations developed have high enough viscosities the paste to ensure direct write printing.

To obtain a BTO ink formulation, barium titanate ceramic powder was added to the BTO sol-gel at a mass ratio of 3 g powder to 1 g sol-gel. The sol-gel and BTO ceramic particles were mixed using a plenary mixer for 30 minutes at 2000 RPM to form a paste.

Three classes of paste formulations were developed as described below: Example 1—Paste of ceramic particles and sol-gel with high boiling point solvents, Example 2—Paste of ceramic particles and sol-gel with polymer binder; and, Example 3—Paste of ceramic particles and sol-gel with both high boiling point solvent and polymer binder.

Example 1—Paste of Ceramic Particle and Sol-Gel with High Boiling Point Solvents A stock solution of 51.5 wt. % propylene carbonate, 46.5 wt. % tetraglyme, 1.22 wt. % 1-hexanol and 0.76 wt. % 2-(2-methoxyethoxy)acetic acid was prepared. To 20 g of the lead-free aqueous sol-gel was added 8.78 g of stock solution. The mixture was then subjected to rotary evaporation at 40° C./200 mbar for 30 minutes and then 40° C./50 mbar for 30 minutes. To the solvent-exchanged sol-gel was added the ultrasonicated PZT powder in ratios of 50 wt. %, 60 wt. % and 66 wt. % of PZT particles. The mixtures were thoroughly mixed by plenary mixing for 30 minutes at 2000 RPM.

Initial experiments demonstrated that simply adding PZT powder to standard aqueous sol-gel solutions did not yield viscous enough inks for 3D printing. To promote the gelation and elevate viscosity of the sol-gel carrier, it was found that a stable gel could be formed by omission of Pb precursor in the synthesis of the PZT sol. This yielded the "lead-free mixture" described in the methods section. The viscosity of the as-prepared sol was measured and its value is presented in FIG. 3. As observed, the viscosity of the as-prepared sol-gel and after 24 h are very similar, going initially from 4.13 cP to 3.29 cP. In order to increase the viscosity of the sol and make it more suitable for 3D printing, a solvent exchange was performed. The viscosity of the sol after solvent exchange is also presented in FIG. 3. The viscosity after solvent exchange increases by an order of magnitude going up to 30.17 cP. However, this viscosity still remains very low for 3D printing as a sol around 150-300 cP is preferred.

Figure 4:
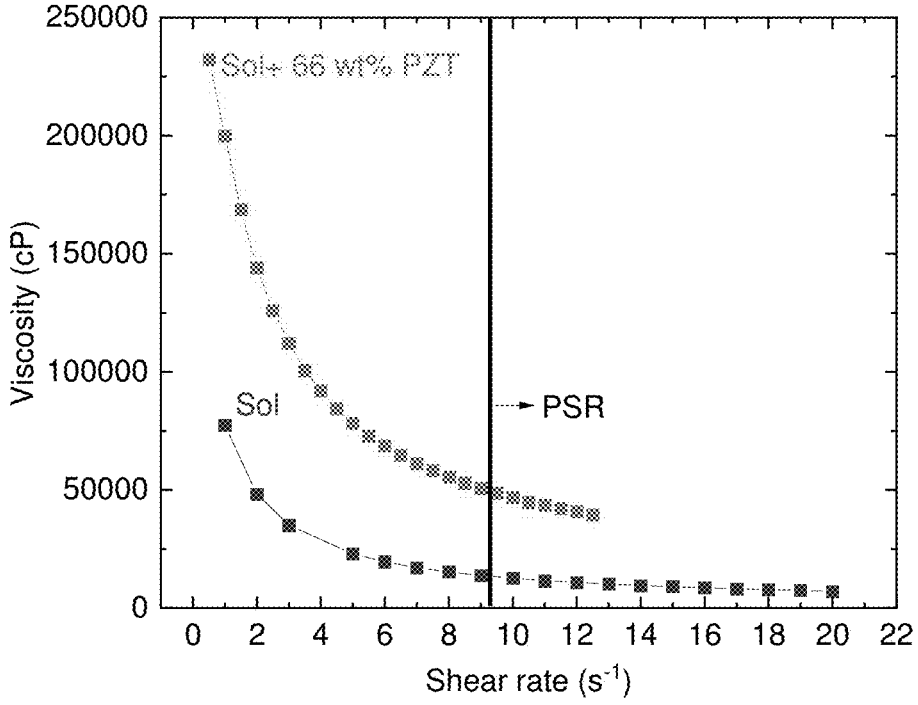
FIG. 4 depicts the viscosity of paste (66 wt. % PZT) and its sol-gel carrier (high boiling point formulation). PSR for a 15 G nozzle and a printing speed of 5 mm s$^{-1}$ is indicated by the dashed black line.

Tuning the relative proportions of the added solvents (see Methods and Materials) and optimizing the aging time ultimately succeeded in yielding a thick carrier sol-gel in the range of 10,000-50,000 cP viscosity (FIG. 4).

Upon plenary mixing with 66 wt. % pure PZT powder, FIG. 4 demonstrates that shear-thinning behaviour is conserved, this time with a far elevated viscosity ranging from 230,000 cP down to about 35,000 cP at elevated shear rate. This dispersion remained stable for greater than 48 hours in storage, with no separation of the solid phase. Applying the PSR calculation for a printing velocity of 5 mm/s and a 15 G nozzle (1.37 mm diameter) yields a printing shear rate of 9.3 s$^{-1}$. This coincides with a viscosity of 50,000 cP in FIG. 4. This value is consistent with that of other extrudable ink formulations for DIW, and thus it was chosen for printing.

Figure 5:
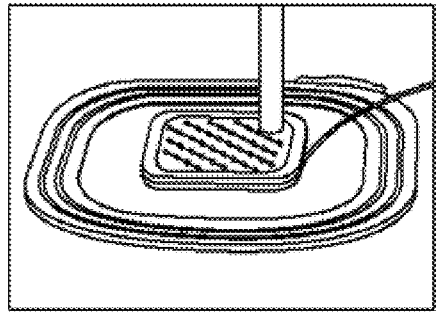
FIG. 5 depicts Images of Pb-free carrier sol-gel+66 wt. % PZT powder ink printed at 5 mm s$^{-1}$.
Figure 5:
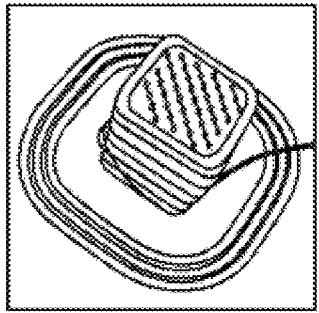
Figure 5:
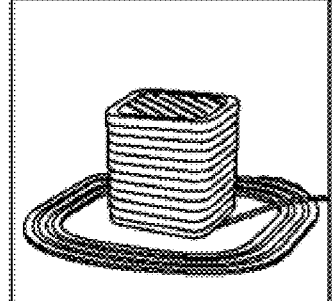

Upon printing, the elevated viscosity Pb-free carrier+PZT powder paste did in fact extrude smoothly, yielding the "cement-like" consistency visible in FIG. 5. Printed traces retained the nozzle width, without any 'runniness' or liquid spilling over into adjacent traces. This produced the consistent trace thickness as well as the resultant porosity between traces visible in the image. The cube in the right-most panel shows that bulk structures can be created with this self-supporting ink. These results present, to our knowledge, the first 3D printed PZT ceramic without an organic matrix.

After 3D printing, the samples were poled and then their $d_{33}$ was measured using a $d_{33}$ tester meter. A force of $250 \times 10^{-3}$ N was applied and the resulting $d_{33}$ was measured. The $d_{33}$ measurements from printed Pb-free+PZT powder samples (2-TL2-p179) are presented below in Table 1. A piezoelectric constant of 30 pC/N is obtained for the sample with 1-layer versus 25.8 pC/N for the 5-layer sample. The $d_{33}$ values reported here represent a milestone as it is the first time that this is reported for an ink based solely on sol-gel and piezo particles.

TABLE 1

| 3D printed PZT tiles made with high boiling point solvent. | |
|---|---|
| Sample ID | $D_{33}$ (pC/N) |
| 3D printed PZT sample - as printed (1 layer) | 30 |
| 3D printed PZT sample - as printed (5 layers) | 25.8 |

Example 2—Paste of Ceramic Particles and Sol-Gel with Polymer Binder

An alternative ink formulation incorporating polyvinylpyrrolidone (PVP) into an aqueous sol-gel (containing Pb) was studied. The PVP acts as a binder, rheology modifier and stabilizer. The sol-gel as-synthesized was mixed with PVP polymer at a concentration of 5 wt. % PVP, based on weight of sol-gel plus polymer. The sol-gel/polymer mixture was mixed in various wt. % with PZT particles as shown in Table 2. The sol-gel and particles were mixed using a plenary mixer for 30 minutes at 2000 RPM.

TABLE 2

| Paste formulations using varying ratios of sol-gel to PZT particles. | | | | |
|---|---|---|---|---|
| Index | Sol-gel* (g) | PZT powder (g) | wt. % PZT powder (%) | Observations |
| 2 | 6.66 | 13.33 | 66.67 | Viscosity too low |
| 3 | 6.66 | 18.33 | 73.33 | Prints but runny |
| 4 | 4.00 | 16.00 | 80.00 | Prints well |

*sol-gel containing 5 wt. % PVP polymer, based on weight of sol-gel plus polymer From several print trials using 66 wt. % PZT (high boiling point formulation), adhesion to the aluminum substrate was important to the characterization of the piezoelectric (see below for details). Upon thermal treatment of printed arrays of transducers, the prints would subsequently delaminate from the surface and proceed to crack under shrinkage stress. With the addition of PVP, not only were we able to form a stable suspension of the sol-gel solution with the ultrasonicated commercial PZT particles, but we were also able to achieve very high loadings of PZT (80 wt. % or more).

Figure 6:
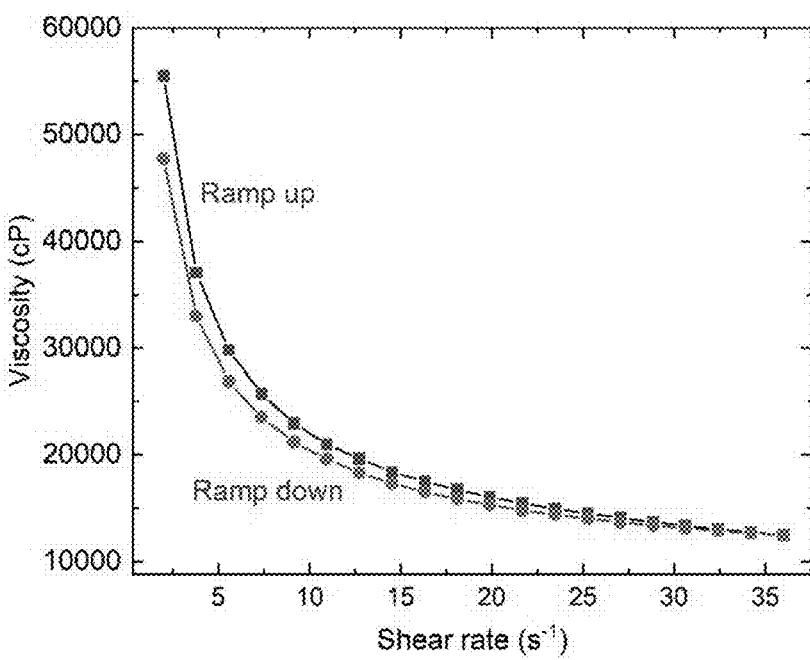
FIG. 6 depicts the viscosity of 73% PZT paste, displaying the shear thinning behavior of the paste in addition to the mild hysteresis of the viscosity.

For the PVP-containing PZT pastes, three formulations were initially tested, incorporating particle loadings of 66 wt. %, 73 wt. % and 80 wt. %. By visual inspection, both the 73 wt. % and the 80 wt. % PZT pastes demonstrated potential for DIW printing, therefore viscosity measurements were performed on both. Rheology measurements were performed on the 73 wt. % PZT paste (FIG. 6) and print tests were performed for both formulations. The formulation containing 73 wt. % PZT particles demonstrated typical shear thinning behaviour associated with particle suspensions with viscosities exceeding 50,000 cP at low shear rates and reaching under 25,000 cP at the PSR. In addition, the paste exhibits mild hysteresis of the viscosity upon decreasing shear rate. The paste's ability to thicken upon removal of shear forces is an important component to the printing of the material, preventing the composite from laterally spreading on the substrate.

The addition of PVP succeeded to promote gelation in the otherwise low-viscosity sol, transforming it into a suitable carrier for PZT powder. This new sol-gel was loaded with 73 wt. % and 80 wt. % powder, which both produced a stable ink of comparable consistency to the ink of Example 1.

Figure 7:
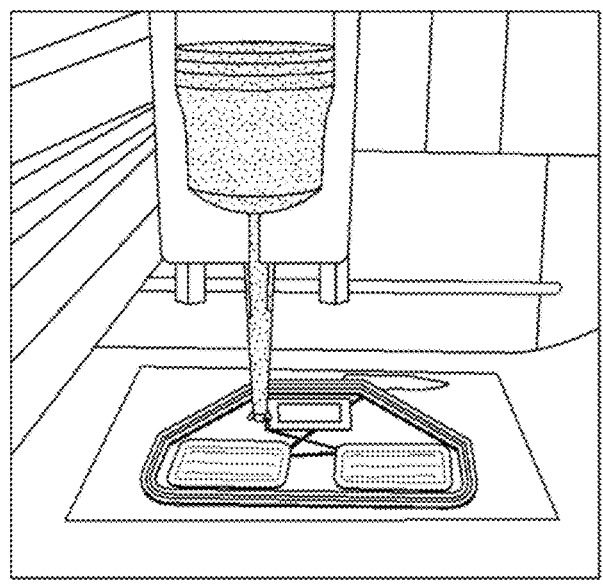
FIG. 7 depicts the single layer deposition of PVP binder+ PZT sol-gel formulation at 5 mm s$^{-1}$.

Preliminary, qualitative 3D printing trials of the new ink have shown great promise, because self-supporting structures were again attained. Single layer structures deposited with this ink are visible in FIG. 7.

Figure 8:
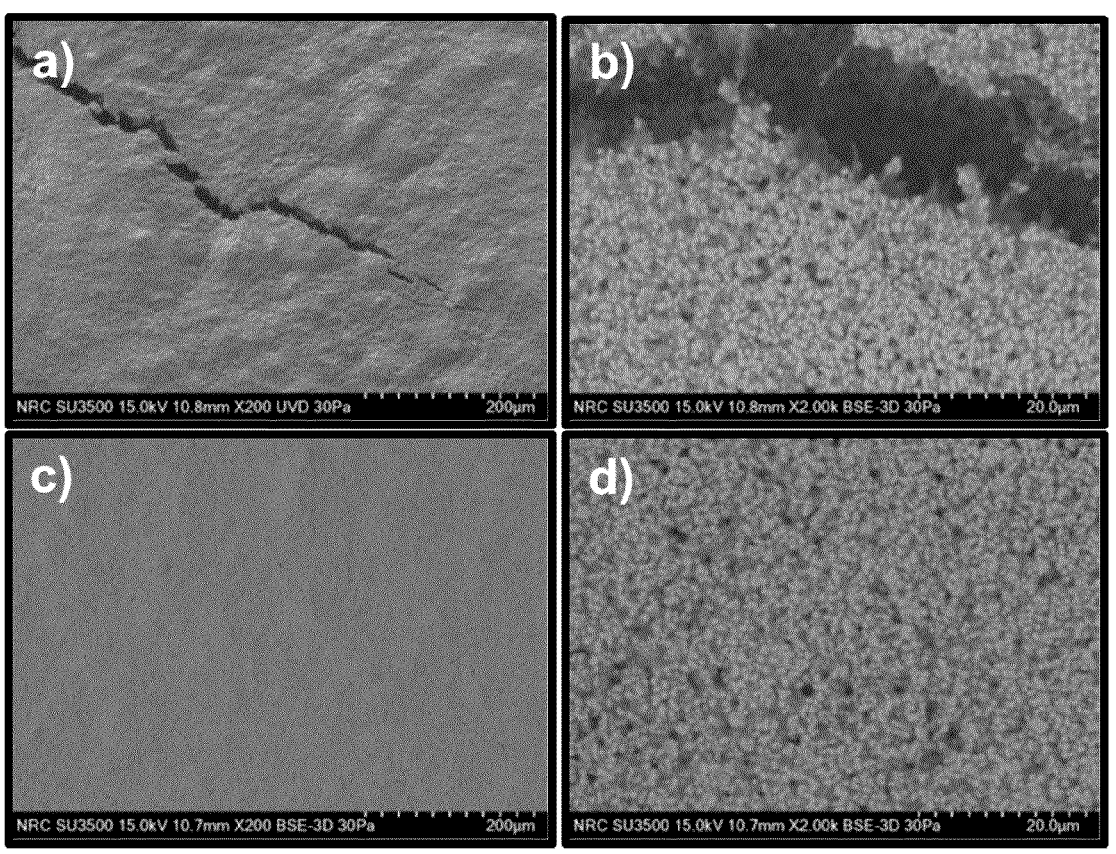
FIG. 8 depicts scanning electron micrographs taken with a Hitachi SU3500 of Direct-Ink Written PZT+PVP binder films (4-TL2-p189) at 200× in SE mode (a, c) and 2000× magnification in BSE mode (b, d).

Backscattered electron micrographs (FIG. 8, *b* and *d*) clearly reveal a low-density matrix in-between PZT particles. This intermediate phase is presumed to comprise the organic PVP phase, as well as other potential trace amounts of organic reaction products trapped in the in the paste. FIG. 8 suggests that the presence of PVP in the sol-gel has a pronounced influence on the microscale porosity of the deposited ink.

Table 3 provides a side-by-side comparison of the formulations of Examples 1 and 2. The formulations using high boiling point solvent (Example 1) and polymer binders (Example 2) are expressed with respect to the weight and volume % of their components.

TABLE 3

| Comparison of Example 1 and Example 2. | | | | |
|---|---|---|---|---|
| | Example 1 | | Example 2 | |
| | wt. % | vol. % | wt. % | vol. % |
| sol | 23.1 | 33.3 | 10.7 | 28.9 |
| solvent | 35.9 | 58.7 | 2.8 | 31.7 |
| Sol-gel | 59 | 92 | 13.5 | 60.6 |
| PVP (1.3 MDa) | 0 | 0 | 1.0 | 2.9 |
| PZT particles | 41.0 | 8 | 80.0 | 36.5 |

Example 3A—Pastes of Ceramic Particles, Sol-Gel, High Boiling Point Solvent and PVP Polymer Binder Pastes with high loading of piezoelectric ceramic material that are compatible with extrusion printing (or direct-write printing) and form self-supporting 3D shapes have been formulated in this Example.

Three printing paste formulations comprising lead zirconium titanate (PZT) ceramic particles, a sol-gel containing PZT nanoparticles, 1-hexanol and a 1 MDa polyvinylpyrrolidone (PVP) were prepared by mixing 1-hexanol and PVP with the PZT sol-gel, and then mixing in various amounts of the PZT ceramic particles in accordance with Table 4 using a plenary mixer for 30 minutes at 2000 RPM. The amount of PVP relative to the amount of sol-gel and 1-hexanol was held constant at 5.0 wt %.

TABLE 4

| Paste formulations with PVP polymer binder varying amounts of PZT | | | | |
|---|---|---|---|---|
| PZT (wt. %) | Sol-gel (wt. %) | 1-Hexanol (wt. %) | PVP (wt. %) | Observations |
| 66.7 | 25.4 | 6.3 | 1.67 | Viscosity too low |
| 73.3 | 20.3 | 5.1 | 1.33 | Prints but runny |
| 80.0 | 15.2 | 3.8 | 1.00 | Prints well |

From several print trials in accordance with Example 1, it became apparent that adhesion to an aluminum substrate was important to the characterization of the piezoelectric. Upon thermal treatment of printed arrays of transducers, the prints from Example 1 were prone to subsequent delamination from the surface and proceeded to crack under shrinkage stress. In Example 3A, with the addition of polymer binder in addition to high boiling point solvent, not only was adhesion to the aluminum substrate promoted, but stable suspensions of the sol-gel solution with the ultrasonicated commercial PZT ceramic particles at very high loadings (80 wt. % or more) was possible.

Figure 9:
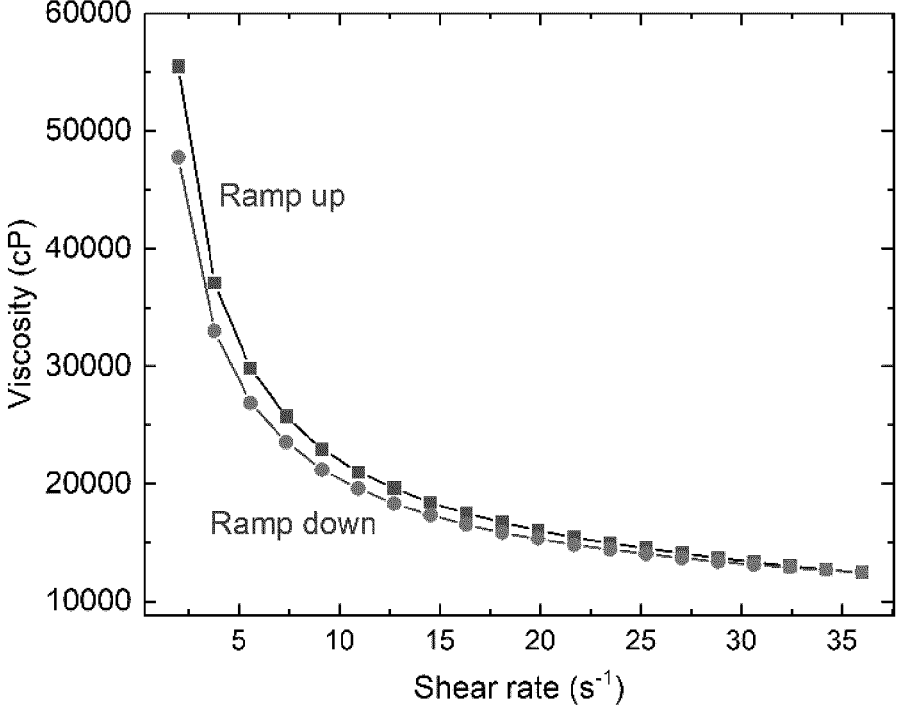
FIG. 9 depicts a graph of shear rate (s$^{-1}$) vs. viscosity (cP) for a printing paste comprising PZT ceramic particles, a sol-gel containing PZT particles, 1-hexanol and PVP.

By visual inspection of the pastes formulated in accordance with Table 4, both the paste with 73.3 wt % and the paste with 80 wt. % PZT demonstrated potential for DIW printing. Rheology measurements were performed on the PZT paste having 73.3 wt. % PZT (FIG. 9) and print tests were performed for both formulations. The formulation containing 73.3 wt. % PZT particles demonstrated typical shear thinning behavior associated with particle suspensions with viscosities exceeding 50,000 cP at low shear rates and reaching under 25,000 cP at the printing shear rate. In addition, the paste exhibits mild hysteresis of the viscosity upon decreasing shear rate. The paste's ability to thicken upon removal of shear forces is important to the printing of the material, preventing the formulation from laterally spreading on the substrate.

Figure 10A:
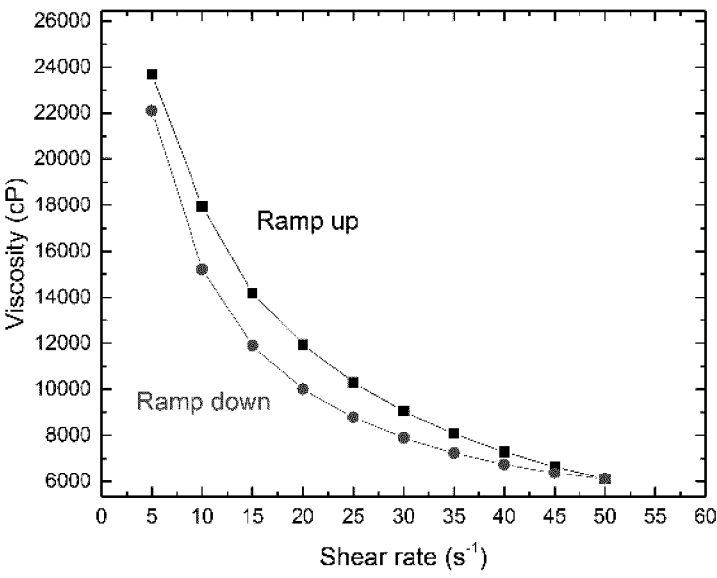
FIG. 10A depicts a graph of shear rate (s$^{-1}$) vs. viscosity (cP) for a printing paste comprising 60 wt. % PZT ceramic particles, a sol-gel containing PZT nanoparticles, 1-hexanol and 0.4 wt. % PEG.
Figure 10B:
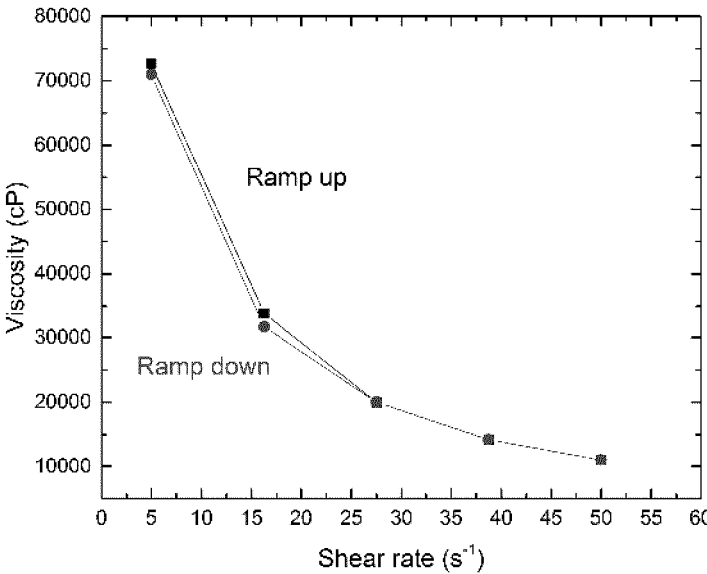
FIG. 10B depicts a graph of shear rate (s$^{-1}$) vs. viscosity (cP) for a printing paste comprising 60 wt % PZT ceramic particles, a sol-gel containing PZT nanoparticles, 1-hexanol and 0.8 wt. % PEG.

Example 3B—Pastes of Ceramic Particles, Sol-Gel, High Boiling Point Solvent and PEG Polymer Binder In a similar fashion to Example 3A, polyethylene glycol (PEG) was used instead of PVP the polymer binder to determine whether similar effects on shear thinning, particle stabilization, substrate adhesion and crack mitigation could be observed. It was found that a 2 MDa PEG, achieved all of the effects observed for PVP, but at a polymer reduced loading. The effect of PEG concentration on the rheology of the pastes is shown in FIG. 10A and FIG. 10B.

In addition to rheological testing, further printing tests on PEG-containing formulations were conducted in accordance with the formulations listed in Table 5 to gauge their self-supporting behavior. Qualitative assessments of the printability of the subsequent formulations are provided in Table 5. It is apparent from Table 5 that the amount of sol-gel is preferably not above 20 wt. %.

TABLE 5

| Paste formulations with PVP polymer binder varying amounts of PZT | | | | |
|---|---|---|---|---|
| PZT (wt. %) | Sol-gel (wt. %) | 1-Hexanol (wt. %) | PEG (wt. %) | Observations |
| 40 | 47.0 | 11.8 | 1.20 | Viscosity too low |
| 40 | 46.1 | 11.5 | 2.40 | Prints but runny |
| 60 | 31.4 | 7.8 | 0.80 | Viscosity too low |
| 60 | 30.7 | 7.7 | 1.60 | Prints but runny |
| 80 | 15.8 | 4.0 | 0.20 | Prints well |
| 80 | 15.7 | 3.9 | 0.40 | Prints well |
| 80 | 15.4 | 3.8 | 0.80 | Prints well |
| 80 | 15.2 | 3.8 | 1.00 | Prints but thick |

Figure 11:
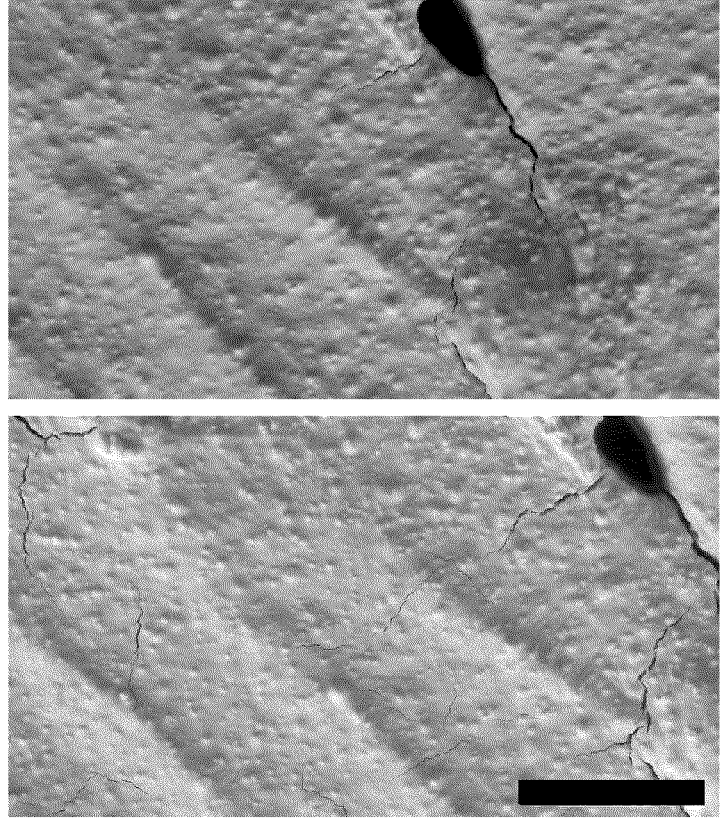
FIG. 11 depicts optical micrographs depicting crack formation in a printed paste as a result of solvent evaporation-induced stress, the paste comprising 80 wt. % PZT ceramic particles, a sol-gel containing PZT nanoparticles, 1-hexanol and 0.4 wt. % PEG, the optical micrographs taken within an hour of printing (top) and after 24 hours (bottom). Scale bar=2 mm.

Following the printing process, optical micrographs were taken of the surface of the printed samples one hour and 24 hours after printing to qualitatively assess the formation of cracks from shrinkage induced by solvent evaporation. FIG. 11 depicts crack formation as a result of solvent evaporation-induced stress within print in a formulation having 80 wt. % PZT and 0.4 wt. % PEG, where the top panel was imaged within an hour of printing and the bottom panel was imaged after 24 hours.

In order to probe the impact of PZT and PEG loading on the piezoelectric properties of the materials, the d33 values were measured for printed sample tiles (3-5 mm thick) that were heat treated at 500° C. for 5 hours. The heat treatment serves to convert the sol-gel into additional PZT that acts as an inorganic binder for the particles after the polymer binder has burned away. Prior to measurement, the samples were electrically poled in a silicone oil bath by way of contact by a high voltage probe. The samples were heated to 125° C., then a voltage of up to 5 kV was applied for 30 min on the heated sample. The heat was removed and the voltage was left on until the sample reached room temperature. As shown in Table 6, there exists a positive correlation between the loading of PZT particles and the resulting d33 values. This could be attributed to the total ceramic content remaining after pyrolysis. Note that the formulations that do not yield self-supporting structures (i.e., particle content too low, polymer content too low) cannot form suitable samples, and therefore d33 measurement is precluded in these cases.

13

TABLE 6

| PEG (wt. %)* | 40 wt. % PZT | 60 wt. % PZT | 80 wt. % PZT |
|---|---|---|---|
| 2 | Unprintable. Does not self-support (viscosity too low). | Extrudable. Does not self-support (viscosity too low). | Printable. d33 = 85 ± 19 pC/N. Minimal cracks after drying. |
| 4 | Printable. d33 = 31 ± 12 pC/N. No cracks after drying. | Printable. d33 = 85 ± 17 pC/N. No cracks after drying. | Printable. d33 = 93 ± 6 pC/N. No cracks after drying. |

*The amount of PEG is based on the total weight of sol-gel, 1-hexanol and PEG.

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A 3-D printable paste formulation comprising:
ceramic particles;
10-20 wt. % of a sol-gel, based on total weight of the formulation;
a high boiling point solvent having a boiling point of at least 100° C.; and,
a binder,
wherein the ceramic particles have an average particle diameter of 500 nm or greater,
and wherein the formulation forms a self-supporting structure on printing and has a viscosity of 15,000 cP to 230,000 cP as measured when printing shear rates are in a range of 5-10 s$^{-1}$.

2. The formulation of claim 1 wherein, the binder is a polymer binder.

3. The formulation of claim 1 wherein the binder is polyvinylpyrrolidone, polyacrylic acid, polyvinyl alcohol, polyethyleneglycol or any combination thereof.

4. The formulation of claim 1, wherein the binder is present in the formulation in an amount in a range of 0.05-5 wt. %, based on the total weight of the formulation.

14

5. The formulation of claim 1, wherein the ceramic particles comprise lead zirconate titanate (PZT) particles or particles of materials having perovskite structures, or any combination thereof.

6. The formulation of claim 1, wherein the ceramic particles comprise BaTiO$_3$, KNbO$_3$, ZnO, BiFO$_3$, Bi$_4$Ti$_3$O$_{12}$ or any combination thereof.

7. The formulation of claim 1, wherein the ceramic particles are PZT particles.

8. The formulation of claim 1, wherein the ceramic particles are present in the formulation in an amount in a range of 40-80 wt. %, based on total weight of the formulation.

9. The formulation of claim 1, wherein the sol-gel comprises nanoparticles of PZT, BaTiO$_3$, KNbO$_3$, ZnO, BiFO$_3$, Bi$_4$Ti$_3$O$_{12}$ or any combination thereof.

10. The formulation of claim 1, wherein the high boiling point solvent comprises an alcohol.

11. The formulation of claim 1, wherein the high boiling point solvent has a boiling point in a range of 100° C. to 250° C.

12. The formulation of claim 1, wherein the high boiling point solvent comprises 1-butanol, 2-methyl-2-propanol, 1-pentanol, 3-methyl-1-butanol, 2,2-dimethyl-1-propanol, cyclopentanol, 1-hexanol, cyclohexanol, 1-heptanol, 1-octanol, propylene carbonate, tetraglyme, 2-(2-methoxyethoxy) acetic acid or any combination thereof or any mixture thereof.

13. The formulation of claim 1, wherein the solvent is present in the formulation in an amount in a range of 3.5-35 wt. %, based on total weight of the formulation.

14. The formulation of claim 1 having a viscosity of 15,000 cP to 200,000 cP as measured when printing shear rates are in a range of 5-10 s$^{-1}$.

15. The formulation of claim 1, wherein the self-supporting structure has a yield stress 100 Pa or greater.

16. A process for producing a piezoelectric material comprising depositing the formulation of claim 1 onto a substrate.

17. The process of claim 16, wherein said depositing comprises printing.

18. The process of claim 17 wherein said printing comprises 2D printing, 3D printing or a combination thereof.

19. The process of claim 16, wherein the depositing comprises direct-write or extrusion 3D-printing.

* * * * *